(12) United States Patent
Li

(10) Patent No.: US 12,727,086 B2
(45) Date of Patent: Sep. 1, 2026

(54) FLEXIBLE CIRCUIT BOARD AND METHOD OF MANUFACTURING THEREOF

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventor: Cheng-Jia Li, Shenzhen (CN)

(73) Assignees: HONGQISHENG PRECISION ELECTRONICS (QINHUANGDAO) CO., LTD., Hebei Province (CN); AVARY HOLDING (SHENZHEN) CO., LTD., Shenzhen (CN); GARUDA TECHNOLOGY CO., LTD., New Tapiei City (TW)

( * ) Notice: Subject to any disclaimer, the term of this patent is extended or adjusted under 35 U.S.C. 154(b) by 185 days.

(21) Appl. No.: 18/675,590

(22) Filed: May 28, 2024

(65) Prior Publication Data

US 2025/0374432 A1 Dec. 4, 2025

(51) Int. Cl.
*H05K 1/14* (2006.01)
*H05K 3/46* (2006.01)

(52) U.S. Cl.
CPC ........... *H05K 1/147* (2013.01); *H05K 3/4691* (2013.01)

(58) Field of Classification Search
CPC ........ H05K 1/02; H05K 1/028; H05K 1/0283; H05K 1/147; H05K 3/4623; H05K 3/4691
USPC ................ 361/749, 767–775, 792–795, 803; 174/254–262; 29/829–854
See application file for complete search history.

(56) References Cited

U.S. PATENT DOCUMENTS 3,335,489 A * 8/1967 Grant .................. H05K 3/4038 174/265
6,990,355 B2 1/2006 Ueyama et al.
8,178,789 B2 * 5/2012 Takahashi ............ H05K 3/4691 361/760
11,950,371 B2 * 4/2024 Li .......................... H05K 3/465
2004/0118595 A1 * 6/2004 Flammer .............. H05K 1/0278 29/830
2006/0202344 A1 * 9/2006 Takada .................. H05K 1/113 257/E23.079

(Continued)

FOREIGN PATENT DOCUMENTS

CN 109548272 A 3/2019
CN 109887971 B 3/2021

(Continued)

*Primary Examiner* — Tuan T Dinh
(74) *Attorney, Agent, or Firm* — MUNCY, GEISSLER, OLDS & LOWE, P.C.

(57) ABSTRACT

A flexible circuit board includes a first circuit substrate having a first metal layer, a second circuit substrate having a second metal layer and at least one electrical connection part. The electrical connection part is electrically connected between the first circuit substrate and the second circuit substrate. The electrical connection part includes a flexible part and at least one liquid metal material. The flexible part is connected between the first circuit substrate and the second circuit substrate and has at least one passage. The passage connects the first metal layer and the second metal layer. The liquid metal material fills the passage and is electrically connected between the first metal layer and the second metal layer.

13 Claims, 7 Drawing Sheets

(56) References Cited

U.S. PATENT DOCUMENTS

2007/0091569 A1* 4/2007 Campbell ........... H10W 40/774
361/699
2010/0103620 A1* 4/2010 Campbell .......... H05K 7/20772
361/702
2011/0203837 A1* 8/2011 Naganuma ........... H05K 3/4691
29/829
2017/0374732 A1* 12/2017 Denda .................... H05K 3/361

FOREIGN PATENT DOCUMENTS

CN 115250563 A 10/2022
CN 117641771 A 3/2024
TW 201722218 A 6/2017
TW 202406418 A 2/2024
TW 202410762 A 3/2024

* cited by examiner

FLEXIBLE CIRCUIT BOARD AND METHOD OF MANUFACTURING THEREOF

BACKGROUND

Technical Field

The disclosure relates to a circuit board and a method of manufacturing a circuit board, and particularly relates to a flexible and stretchable circuit board and a method of manufacturing thereof.

Description of Related Art

In known foldable or bendable electronic products, communication among different modules is typically realized by using cables and board-to-board connectors (BTB), which not only occupies the internal space of the electronic products, but also impedes the realization of lighter, thinner, and miniaturized designs. In addition, after repeated being bent or stretched, the cables are easy to cracking or breaking, significantly reducing the lifetime of the electronic products. Furthermore, in applications that require frequent plugging, unplugging, or movement of various modules, vibrations may cause poor contact between the cables or the BTB connectors and the modules, resulting in reduced stability and reliability of the connections.

SUMMARY

A flexible circuit board is provided. The flexible circuit board includes a first circuit substrate, a second circuit substrate, and at least one electrical connection part. The first circuit substrate has at least one first metal layer. The second circuit substrate has at least one second metal layer. The at least one electrical connection part is electrically connected between the first circuit substrate and the second circuit substrate, and includes a flexible part and at least one liquid metal material. The flexible part is electrically connected between the first circuit substrate and the second circuit substrate and has at least one passage. The passage connects the at least one first metal layer and the at least one second metal layer. The at least one liquid metal material fills the passage. The at least one liquid metal material is electrically connected between the at least one first metal layer and the at least one second metal layer.

According to an embodiment of the disclosure, the flexible part includes flexible lines. The flexible lines include the passage apiece. The flexible lines, the first circuit substrate and the second circuit substrate seal the liquid metal material.

According to an embodiment of the disclosure, a distance between any two adjacent flexible lines is greater than or equal to 20 microns.

According to an embodiment of the disclosure, each of the flexible lines has a width, and the width decreases as the flexible lines are stretched.

According to an embodiment of the disclosure, each of the flexible lines has a length, and a stretchable length of each of the flexible lines is less than or equal to 1.5 times the length.

According to an embodiment of the disclosure, each of the flexible lines and the liquid metal material have a first resistance value before being bent, each of the flexible lines and the liquid metal material have a second resistance value after being bent, and the first resistance value and the second resistance are the same.

According to an embodiment of the disclosure, the flexible lines are placed alongside of each other.

According to an embodiment of the disclosure, the liquid metal material includes a liquid mercury metal and liquid metal alloys.

A method of manufacturing a flexible circuit board is provided. The method includes providing a first circuit substrate, and the first circuit substrate includes a first metal layer; disposing a flexible material layer on the first metal layer; disposing a sacrificial layer on the flexible material layer; forming slots on the sacrificial layer, and the slots expose portions of the first metal layer; coating an inner wall of the slots and a portion of surface of the sacrificial layer with a flexible material after forming the slots on the sacrificial layer, and a bottom portion of the slots that is not coated with the flexible material exposes a portion of the first metal layer; filling the slots with a liquid metal material for the liquid metal material to electrically connect the first metal layer after coating the inner wall of the slots and the portion of surface of the sacrificial layer with the flexible material; disposing a second metal layer on the flexible material and the liquid metal material for the liquid metal material further electrically connects to the second metal layer in the slots; sealing the liquid metal material between the first circuit substrate, the flexible material, and the second metal layer; forming at least one circuit structure on the second metal layer; and removing the sacrificial layer after forming the at least one circuit structure.

According to an embodiment of the disclosure, the method further includes forming the circuit structure including circuit layers by using a build-up process.

According to an embodiment of the disclosure, the method further includes disposing circuit components on the circuit layers.

According to an embodiment of the disclosure, the at least one circuit structure is at least one first circuit structure, and the method further includes forming at least one second circuit structure on the first metal layer.

According to an embodiment of the disclosure, the liquid metal material is sealed between the first circuit substrate, the flexible material, and the second metal layer by using one of the heating and pressurization methods.

According to an embodiment of the disclosure, materials of the flexible material and the flexible material layer are the same.

According to an embodiment of the disclosure, the liquid metal material fills the slots by using a casting method.

DETAILED DESCRIPTION

Figure 1:
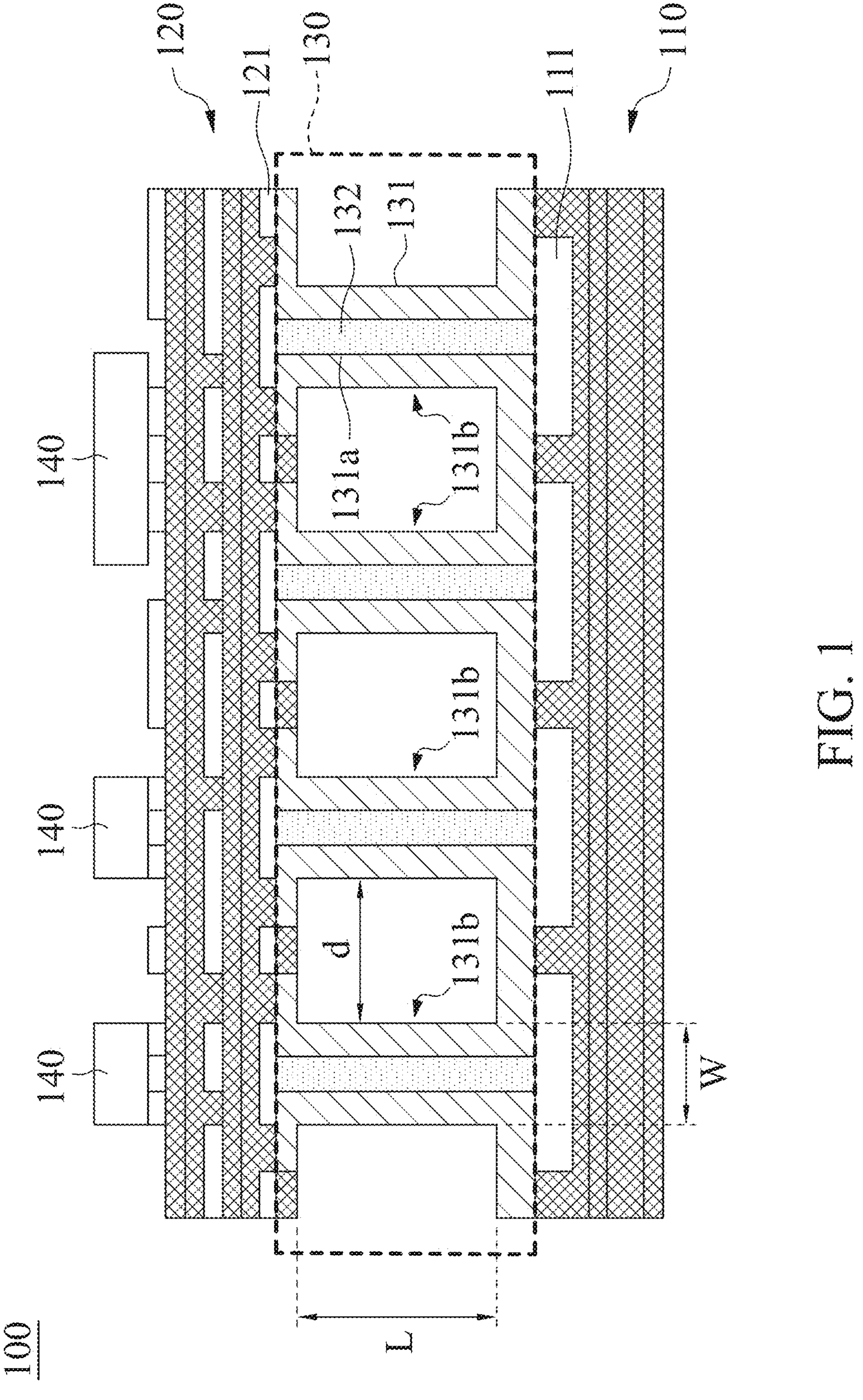
FIG. 1 is a schematic diagram showing a cross-sectional view of a flexible circuit board in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, FIG. 1 is a schematic diagram showing a cross-sectional view of a flexible circuit board 100 in accordance with an embodiment of the present disclosure. The flexible circuit board 100 includes a first circuit substrate 110, a second circuit substrate 120, and at least one electrical connection part 130. A first metal layer 111 is disposed on the first circuit substrate 110, and a second metal layer 121 is disposed on the second circuit substrate 120. The electrical connection part 130 is electrically connected between the first circuit substrate 110 and the second circuit substrate 120 and includes a flexible part 131 (as shown in slashed areas) and a liquid metal material 132 (as shown in dot areas). The flexible part 131 is configured to connect the first circuit substrate 110 and the second circuit substrate 120, and has at least one passage 131*a*. The passage 131*a* connects the first metal layer 111 and the second metal layer 121, and the liquid metal material 132 fills the passage 131*a*. Therefore, the liquid metal material 132 can electrically connect the first metal layer 111 and the second metal layer 121, thereby realizing signal transmission between the first circuit substrate 110 and the second circuit substrate 120.

In the embodiments of the present disclosure, the first circuit substrate 110 includes but is not limit to, electrically connected to at least one of a mainboard and a battery module, and the second circuit substrate 120 includes but is not limit to, electrically connected to at least one of a display screen, a camera and a headphone. Signal transmission is achieved between the first circuit substrate 110 and the second circuit substrate 120 through the stretchable and repeatedly bendable electrical connection part 130, so that the flexible circuit board 100 can be widely used in any electronic device that needs to be bent or stretched many times.

The first circuit substrate 110 and the second circuit substrate 120 can be a circuit structure having one or more circuit layers, and various required circuit components 140 can be mounted on the circuit structure. The circuit layers include at least one first metal layer 111 located at the first circuit substrate 110 and at least one second metal layer 121 located at the second circuit substrate 120. In some embodiments, the liquid metal material 132 filling the passage 131*a* directly contacts the first metal layer 111 and the second metal layer 121, which enables the connections between the liquid metal material 132 and the first circuit substrate 110 and the second circuit substrate 120 to achieve electrical connection and signal transmission without providing additional electrical connection parts or soldering pads.

In this embodiment, the flexible part 131 includes many flexible lines 131*b*. Each of the flexible lines 131*b* includes the passage 131*a*, and the flexible lines 131*b* seal the liquid metal material 132 with the first circuit substrate 110 and the second circuit substrate 120. In some embodiments, each of the flexible lines 131*b* can be placed alongside of each other and are substantially parallel. The mentioned substantially parallel means that two adjacent flexible lines 131*b* can be slightly non-parallel without affecting the operations and functions of the flexible part 131. In some embodiments, a distance d between any two adjacent flexible lines 131*b* is greater than or equal to 20 microns (μm).

The flexible lines 131*b* and the liquid metal material 132 filling the inner of the flexible lines 131*b* make the flexible part 131 stretchable, bendable and shock-absorbing, which ensures that the flexible part 131 can maintain the stability of electrical properties and signal transmission when it is arbitrarily stretched and bent between the first circuit substrate 110 and the second circuit substrate 120. In some embodiments, the liquid metal material 132 completely fills the internal space of the passage 131*a*, which means the internal space of the passage 131*a* does not leave any gaps or contain any air virtually. In this way, the stability of electrical connection between the flexible part 131 and the first circuit substrate 110 and the second circuit substrate 120 can be ensured.

The liquid metal material 132 is an amorphous liquid metal material or metal alloy material, which has fluidity, moldability and high thermal conductivity, so that the liquid metal material 132 can deform accordingly as the flexible lines 131*b* are stretched and bent. The liquid metal material 132 includes but is not limit to liquid mercury metal, rubidium and cesium metals with low melting point, lead-tin alloy, aluminum alloy, copper alloy, gallium indium tin alloy (galinstan), the aforementioned metal alloys, or other liquid metal alloys. The flexible lines 131*b* can be made of elastomer, rubber or other materials that can be stretched and restored.

In the embodiments of the disclosure, when the flexible line 131*b* is stretched, a width of the flexible line 131*b* will gradually narrow inward as a length increases, and correspondingly affects the shape of the liquid metal material 132 filling the flexible line 131*b*. As shown in FIG. 1, when the flexible lines 131*b* are not stretched, the length of each of the flexible lines 131*b* is L, and the width of each of the flexible lines 131*b* is W.

When the first circuit substrate 110 and the second circuit substrate 120 gradually move away from each other as the flexible lines 131*b* are stretched, the length L will gradually increase, and the width W will gradually narrow. In addition, variations in the length L and width W of the flexible lines 131*b* will also affect the overall on-resistance. Specifically, the on-resistance will gradually increase as the length L gradually increases and the width W gradually narrows. In some embodiments, a maximum stretchable length of each of the flexible lines 131*b* is less than or equal to 1.5 times the length L.

Figure 2:
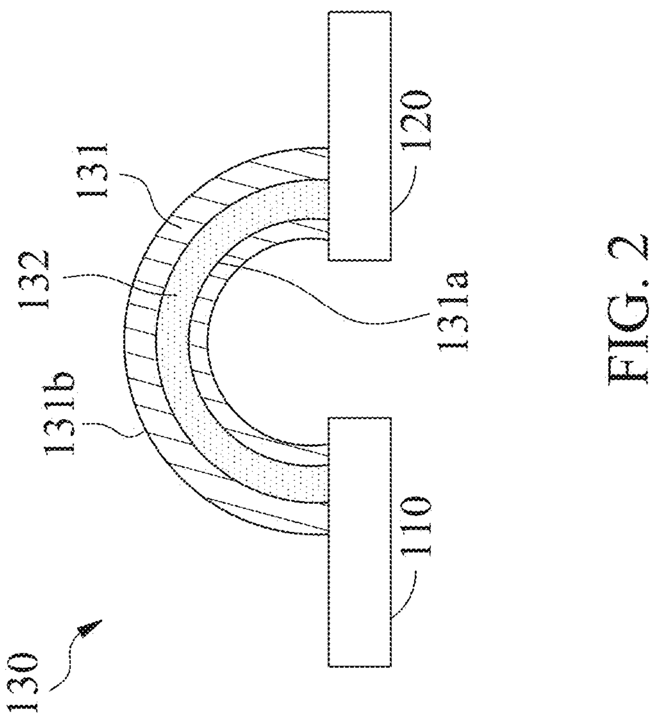
FIG. 2 is a schematic diagram showing an electrical connection part being bent between a first circuit substrate and a second circuit substrate in accordance with an embodiment of the present disclosure.

Referring to FIG. 2, FIG. 2 is a schematic diagram showing the electrical connection part 130 being bent between the first circuit substrate 110 and the second circuit substrate 120 in accordance with an embodiment of the present disclosure. The first circuit substrate 110 and the second circuit substrate 120 can be electrically connected to two electronic devices or circuits (for example, a mainboard and a display screen) respectively, and the disclosure is not limited thereto.

In the case of bending the flexible lines 131*b* without stretching, the overall on-resistance and the length L of the flexible lines 131*b* and the liquid metal material 132 are substantially the same as those without bending. For example, the flexible lines 131*b* and the liquid metal material 132 filling therein have a first resistance value before being bent, and have a second resistance value after being bent. The first resistance value and the second resistance are substantially the same, or a difference between the first resistance value and the second resistance does not exceed a predetermined value.

This is because the material of the flexible lines 131*b* is flexible and elastic, and the liquid metal material 132 filling the passage 131*a* is fluid and moldable, so that the electrical connection part 130 can maintain an inner diameter of the passage 131*a* when bending. In this way, the overall on-resistance of the flexible lines 131*b* and the liquid metal material 132 will not be changed too much. It should be understood that although FIG. 2 only illustrates the electrical connection part 130 with one flexible line 131*b*, in fact the electrical connection part 130 may have many flexible lines 131*b* as shown in FIG. 1.

Figure 3B:
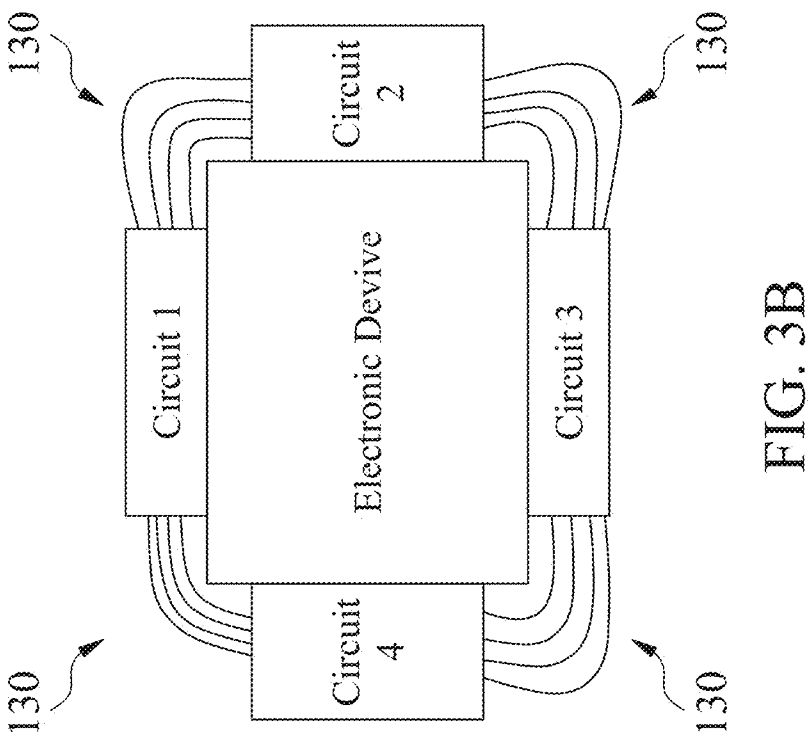
FIG. 3B is a schematic diagram showing an electronic device having many electrical connection part and circuits in accordance with an embodiment of the present disclosure.
Figure 3A:
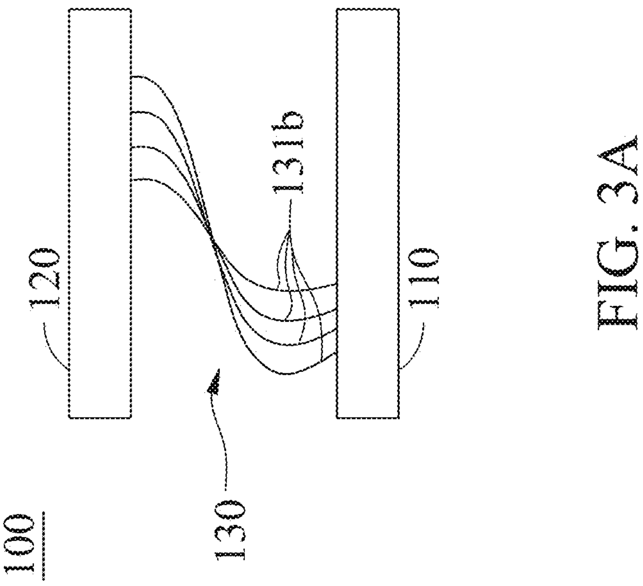
FIG. 3A is a schematic diagram showing flexible lines of the electrical connection part showing a rotating pattern in accordance with an embodiment of the present disclosure.

Referring to FIG. 3A, FIG. 3A is a schematic diagram showing the flexible lines 131*b* of the electrical connection part 130 showing a rotating pattern in accordance with an embodiment of the present disclosure. In the example of FIG. 3A, the electrical connection part 130 between the first circuit substrate 110 and the second circuit substrate 120 includes many flexible lines 131*b*, and each of the flexible lines 131*b* is filled with the liquid metal material 132 (not shown). The flexible lines 131*b* can realize any type of wiring in a three-dimensional (3D) space as needed, such as staggered and stacked with each other, so that the flexible circuit board 100 of the present disclosure can be accommodated more flexibly and fitly in various electronic devices.

Referring to FIG. 3B, FIG. 3B is a schematic diagram showing an electronic device having many electrical connection part 130 and circuits 1~4 in accordance with an embodiment of the present disclosure. Every two circuit modules in the circuits 1~4 and one electrical connection part 130 can be regarded as a set of flexible circuit board 100 as shown in FIG. 1. The circuits 1~4 include many electrical connection parts 130 to achieve electrical connection between each other. Based on characteristics of the flexible part 131 and the liquid metal material 132 (not shown) in the electrical connection part 130, the multiple sets of flexible circuit boards 100 of the electronic device can adapt to various curved surfaces and shapes, and maintain good electrical characteristics under bending, stretching, and twisting conditions.

Referring to FIGS. 4A to 4G, FIGS. 4A to 4G are schematic diagrams showing manufacturing processes of manufacturing a flexible circuit board in accordance with an embodiment of the present disclosure. In the following, a flexible circuit board 400 is similar to the flexible circuit board 100 shown in FIG. 1, and the manufacturing processes shown in FIGS. 4A to 4G also can be used to manufacture the flexible circuit board 100 shown in FIG. 1. It should be understood that although some operations are briefly described below, in fact the manufacturing processes may include other additional operations, and the manufacturing sequence provided is not intended to be limiting. For example, some operations can be performed in a different sequence, and some additional operations can be modified appropriately.

Figure 4A:
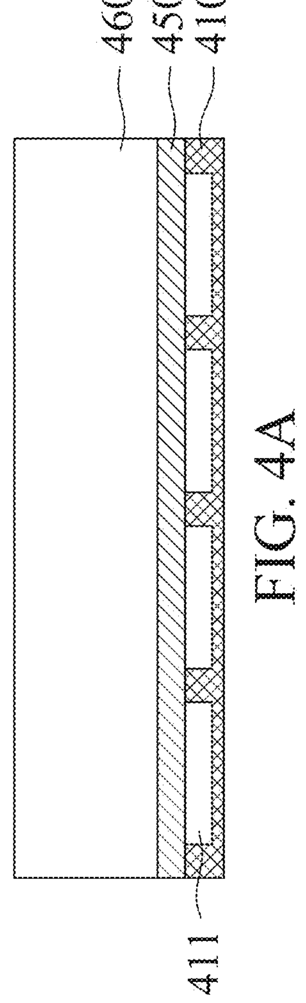
FIGS. 4A to 4G are schematic diagrams showing manufacturing processes of a flexible circuit board in accordance with an embodiment of the present disclosure.

In FIG. 4A, a first circuit substrate 410' is provided first. The first circuit substrate 410' may first form a first metal layer 411, such as a copper layer. The first metal layer 411 is, for example, a trace layer, which can be formed by a semi-additive process (SAP), or can also be formed by a subtractive process, that is, the first metal layer 411 can be formed by photolithography and etching processes. Then, a sacrificial layer 460 is disposed on the first metal layer 411. In the embodiments of the disclosure, a flexible material layer 450 can be formed on the first circuit substrate 410' and the first metal layer 411 before the sacrificial layer 460 is formed.

Figure 4B:
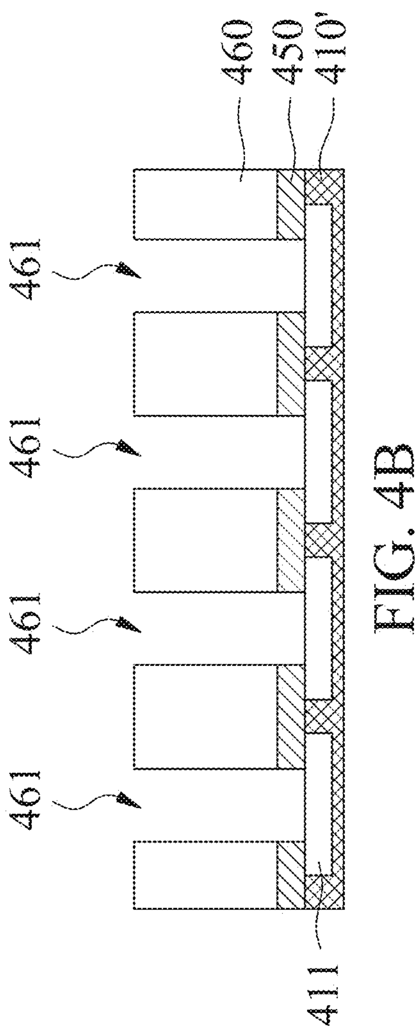

In FIG. 4B, multiple slots 461 are formed on the sacrificial layer 460 to expose the first metal layer 411 under the sacrificial layer 460. Specifically, in embodiments including the flexible material layer 450, the slots 461 also extend through the flexible material layer 450 disposed on the first circuit substrate 410' and the first metal layer 411 to expose portion of the surface of the first metal layer 411. The slots can be formed through processes such as die stamping, laser slotting, laser ablation, wet etching or dry etching, and the present disclosure is not limited thereto.

Figure 4C:
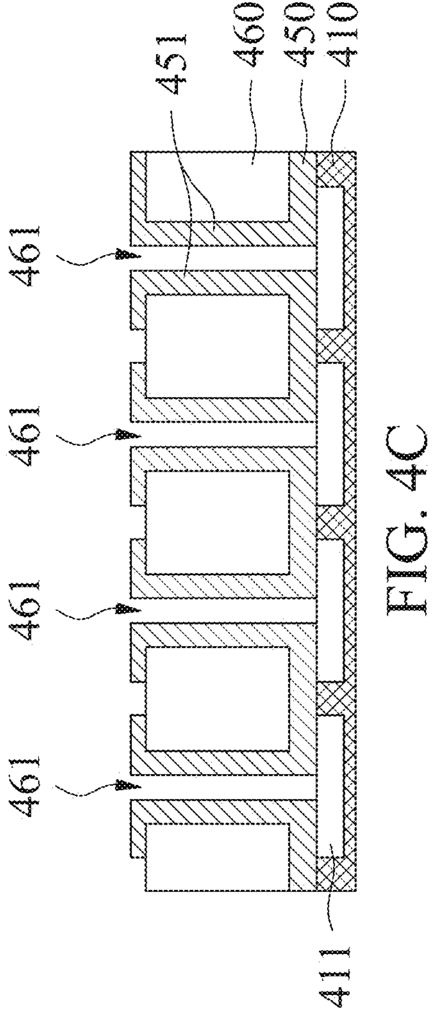

In FIG. 4C, an inner wall of each of the slots 461 and a portion of surface of the sacrificial layer 460 is coated with a flexible material 451 after forming the slots 461 on the sacrificial layer 460. The flexible material 451 extends to connect the flexible material layer 450 under the sacrificial layer 460. A bottom portion of the slots 461 that is not coated with the flexible material 451 exposes a portion of the first metal layer 411. As a result, the flexible material layer 450 and the flexible material 451 can form the flexible part 131 shown in FIG. 1, and the space in the slots 461 that is not filled with the flexible material 451 can form the passage 131*a* shown in FIG. 1. In the embodiments of the disclosure, the materials used for the flexible material 451 and the flexible material layer 450 may be the same or different. When the materials are the same, the flexible material 451 and the flexible material layer 450 can be better connected or blended to each other.

Figure 4D:
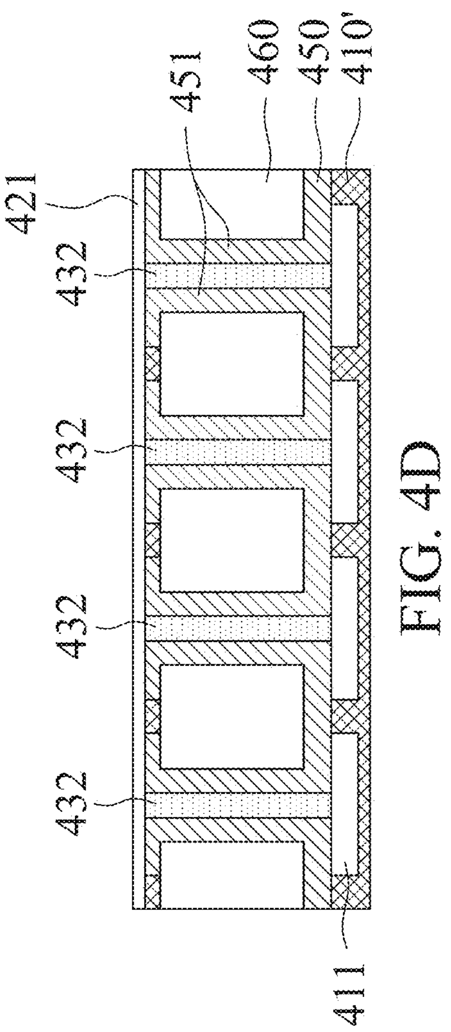

In FIG. 4D, each of the slots 461 is filled with a liquid metal material 432 to electrically connect the first metal layer 411 after coating the inner wall of the slots 461 and the portion of surface of the sacrificial layer 460 with the flexible material 451. Next, a second metal layer 421 is disposed on the flexible material 451 and the liquid metal material 432, so that the liquid metal material 432 electrically connects to the second metal layer 421 in the slots 461. Afterwards, the liquid metal material 432 is sealed between the first metal layer 411, the flexible material 451 and the second metal layer 421 by using heating or pressurization methods. The liquid metal material 432 can fill the slots 461 using methods such as printing, spraying or casting.

Figures 4E, 4F:
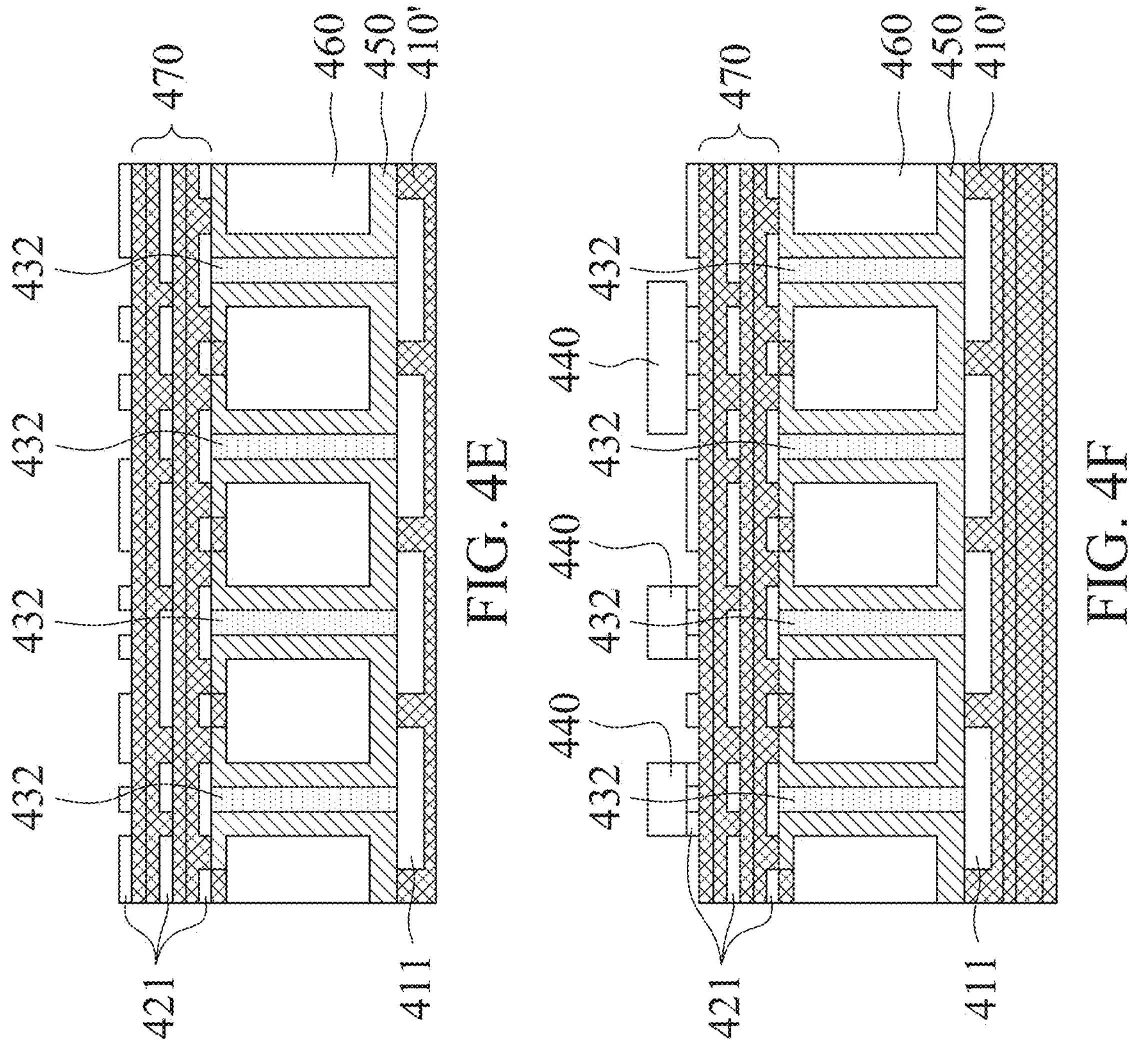

In FIG. 4E, the at least one circuit structure 470 is formed on the second metal layer 421 after sealing the liquid metal material 432 between the first metal layer 411, the flexible material 451, and the second metal layer 421. The circuit structure 470 can be formed by using a build-up process, so that the circuit structure 470 includes many circuit layers. Each of the circuit layers may include the second metal layer 421. In some embodiments, at least one circuit structure (not labeled) is further formed on the first metal layer 411, and it can also be formed by using the build-up process.

In FIG. 4F, many circuit components 440 are mounted on the circuit layers of the circuit structure 470. The circuit components 440 may be, for example, a connector, a capacitor, an inductor, a transistor, a resistor, a diode, or any required electronic components to implement a functional circuit on the flexible circuit board 400.

Figure 4G:
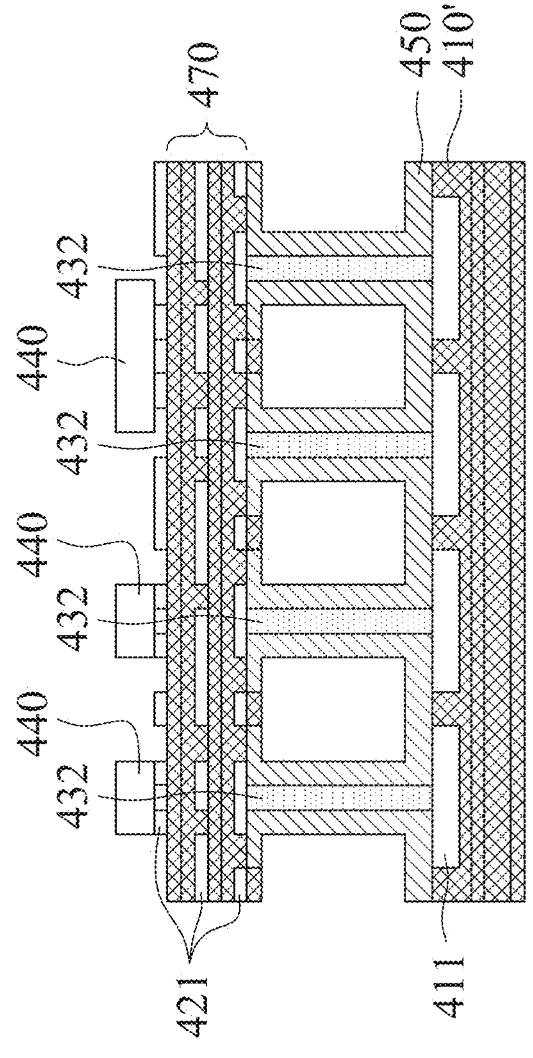

Finally, referring to FIG. 4G. After the circuit structure 470 is formed, the sacrificial layer 460 is removed. The sacrificial layer 460 can be removed using peeling techniques, chemical treatments, or physical methods such as grinding and scraping. As a result, the flexible circuit board 400 is basically completed.

The flexible circuit board and method of manufacturing thereof of the present application use the properties of the flexible part and the liquid metal material filling therein to make the flexible circuit board less prone to cracking or breaking after being bent or stretched. In this way, the bending resistance, heat-dissipation ability and shock-absorbing ability of the flexible circuit board are effectively improved. In addition, the flexible part and the liquid metal material of the disclosure are used to replace cables and board-to-board connectors, and the liquid metal material is sealed between two circuit substrates to achieve electrical connection. As a result, the risk of poor contact is reduced and the reliability of the electrical connection is improved.

Although the description provided above is of various embodiments of the disclosure, this should not limit the scope of the disclosure. Those with ordinary skill in the art can make various modifications without departing from the spirit and scope of the disclosure. Therefore, the scope of protection of the present disclosure shall be determined by the following claims.

What is claimed is:

1. A flexible circuit board, comprising:

a first circuit substrate having at least one first metal layer;

a second circuit substrate having at least one second metal layer; and at least one electrical connection part electrically connected between the first circuit substrate and the second circuit substrate, and comprising:

a flexible part electrically connected between the first circuit substrate and the second circuit substrate and having at least one passage, wherein the passage connects the at least one first metal layer and the at least one second metal layer; and at least one liquid metal material filling the passage, wherein the at least one liquid metal material is electrically connected between the at least one first metal layer and the at least one second metal layer, wherein the flexible part comprises:

a plurality of flexible lines, comprising the passage apiece, wherein the flexible lines, the first circuit substrate and the second circuit substrate seal the at least one liquid metal material, wherein each of the flexible lines has a length, and a stretchable length of each of the flexible lines is less than or equal to 1.5 times the length.

2. The flexible circuit board of claim 1, wherein a distance between any two adjacent flexible lines is greater than or equal to 20 microns.

3. The flexible circuit board of claim 1, wherein each of the flexible lines has a width, and the width decreases as the flexible lines are stretched.

4. The flexible circuit board of claim 1, wherein each of the flexible lines and the liquid metal material have a first resistance value before being bent, while each of the flexible lines and the liquid metal material have a second resistance value after being bent, wherein the first resistance value and the second resistance value are the same.

5. The flexible circuit board of claim 1, wherein the flexible lines are placed alongside of each other.

6. The flexible circuit board of claim 1, wherein the at least one liquid metal material comprises a liquid mercury metal and liquid metal alloys.

7. A method of manufacturing a flexible circuit board, comprising:

providing a first circuit substrate, wherein the first circuit substrate comprises a first metal layer;

disposing a flexible material layer on the first metal layer;

disposing a sacrificial layer on the flexible material layer;

forming a plurality of slots on the sacrificial layer, wherein the plurality of slots expose portions of the first metal layer;

coating an inner wall of the plurality of slots and a portion of surface of the sacrificial layer with a flexible material after forming the plurality of slots on the sacrificial layer, wherein a bottom portion of the plurality of slots that is not coated with the flexible material exposes a portion of the first metal layer;

filling the plurality of slots with a liquid metal material for the liquid metal material to electrically connect the first metal layer after coating the inner wall of the plurality of slots and the portion of surface of the sacrificial layer with the flexible material;

disposing a second metal layer on the flexible material and the liquid metal material for the liquid metal material further electrically connects to the second metal layer in the plurality of slots;

sealing the liquid metal material between the first circuit substrate, the flexible material, and the second metal layer;

forming at least one circuit structure on the second metal layer; and removing the sacrificial layer after forming the at least one circuit structure.

8. The method of claim 7, further comprising:

forming the circuit structure comprising a plurality of circuit layers by using a build-up process.

9. The method of claim 7, wherein the at least one circuit structure is at least one first circuit structure, the method further comprising:

forming at least one second circuit structure on the first metal layer.

10. The method of claim 7, wherein the liquid metal material is sealed between the first circuit substrate, the flexible material, and the second metal layer by using one of heating and pressurization methods.

11. The method of claim 7, wherein materials of the flexible material and the flexible material layer are the same.

12. The method of claim 7, wherein the liquid metal material fills the plurality of slots by using a casting method.

13. The method of claim 8, further comprising:

disposing a plurality of circuit components on the plurality of circuit layers.

* * * * *